United States Patent [19]
Kobayashi et al.

[11] Patent Number: 5,574,993
[45] Date of Patent: Nov. 12, 1996

[54] MOBILE COMMUNICATION APPARATUS AND METHOD

[75] Inventors: Kunio Kobayashi, Takasaki; Tetsuaki Adachi, Nagano-ken; Tsuyoshi Shibuya, Komoro, all of Japan

[73] Assignees: Hitachi, Ltd., Tokyo; Hitachi Tohbu Semiconductor, Ltd., Saitama-ken, both of Japan

[21] Appl. No.: 308,669

[22] Filed: Sep. 19, 1994

[30] Foreign Application Priority Data

Sep. 24, 1993 [JP] Japan .................................. 5-261646
Jun. 23, 1994 [JP] Japan .................................. 6-164506

[51] Int. Cl.$^6$ ................................................ H09B 1/04
[52] U.S. Cl. ........................... 455/126; 455/69; 455/127
[58] Field of Search .................................... 455/282, 126, 455/33.2, 323, 113, 116, 108, 69, 70, 127, 117

[56] References Cited

U.S. PATENT DOCUMENTS

| | | | |
|---|---|---|---|
| 4,999,583 | 3/1991 | Washburn et al. | 455/126 |
| 5,109,390 | 4/1992 | Gilhousen et al. | 455/33.2 |
| 5,307,512 | 4/1994 | Mitzlaff | 455/126 |
| 5,321,849 | 6/1994 | Lemson | 455/282 |

FOREIGN PATENT DOCUMENTS 3-229526  10/1991  Japan .
4-037323  2/1992  Japan .

OTHER PUBLICATIONS

*Hitachi Review*, (Semiconductor Technology for Mobile Communications), Jun. 1993, vol. 42, No. 3, pp. 95–118. (English).
U.S. application Ser. No. 08/192,301, filed Feb. 4, 1994.

*Primary Examiner*—Chi H. Pham
*Attorney, Agent, or Firm*—Fay, Sharpe, Beall, Fagan, Minnich, & McKee

[57] ABSTRACT

A mobile communication apparatus is provided, in which the linearity during a small output power of a radio-frequency power amplifier can be maintained as during a large output power. The input signal power to a radio-frequency power amplifier is decreased by an attenuator during a small power output. The resulting downward trend of the transmission signal power is compensated for by increasing the gain of the radio-frequency amplifier circuit through a transmission power control circuit. Under this condition, the radio-frequency power amplifier is made operable in a linear region of the transistor in the same manner as during a large power output. As a result, the linearity of the amplifier is guaranteed over the whole operating range of the transmission power.

14 Claims, 14 Drawing Sheets

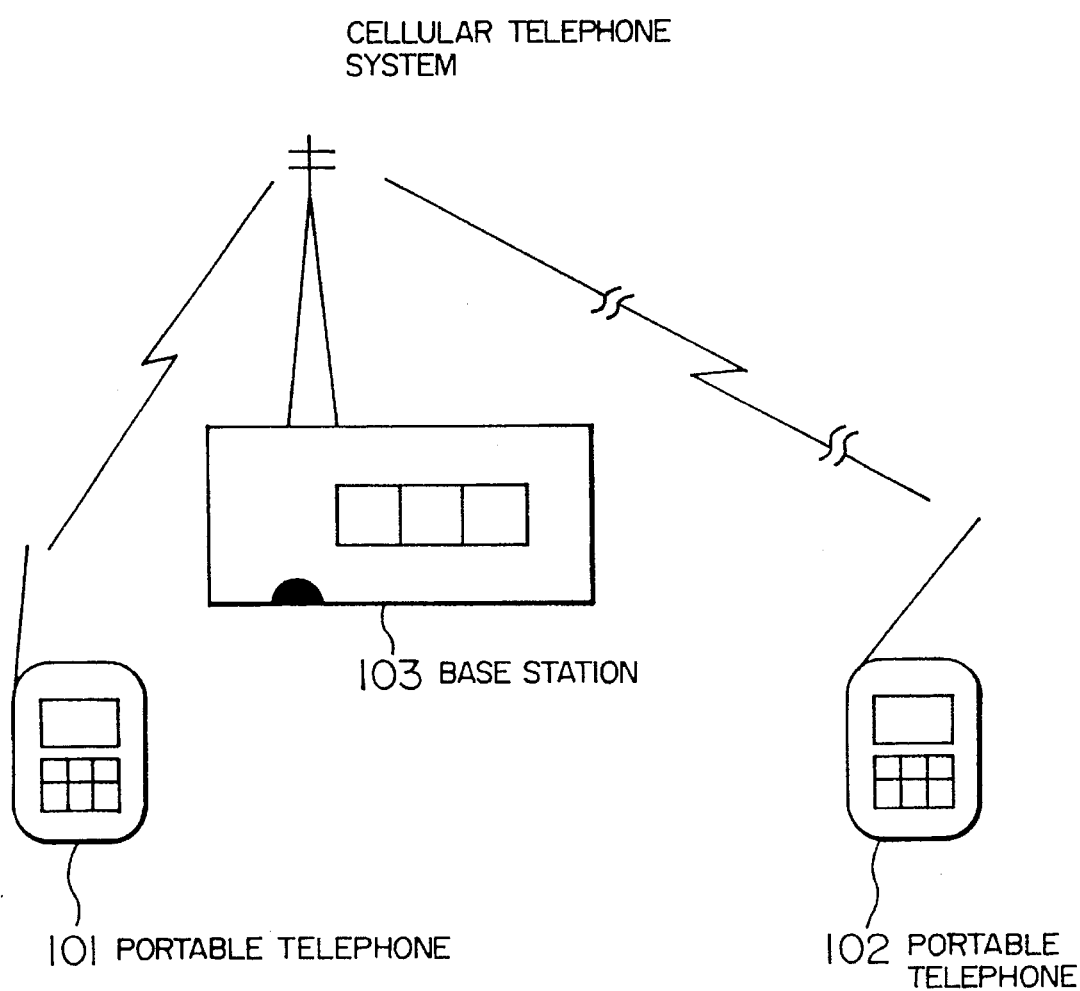

MOBILE COMMUNICATION APPARATUS AND METHOD

CROSS-REFERENCE TO RELATED APPLICATIONS

This application relates to a U.S. application Ser. No. 08/192 301 filed Feb. 4, 1994, now abandoned which is a continuation application Ser. No. 07/778,452 filed Oct. 17, 1991, now abandoned. The disclosure of that application is incorporated herein by reference.

BACKGROUND OF THE INVENTION

The present invention relates to a mobile communication apparatus and method, or more in particular to a mobile radio communication apparatus employing a digital modulation scheme requiring a comparatively wide range of output power and the linearity of a radio-frequency amplification section. The invention specifically relates, for example, to a mobile communication technique effectively applicable to automobile telephones and portable radio telephones (hereinafter referred to simply as "handy telephone" or "the portable phone") used in a cellular telephone system.

The portable phone is based on the technique for restricting the transmission power in such a manner that the radio wave is prevented from propagating to an excessively far point and for using the same frequency at a far point, i.e., in other cells in order to permit servicing as many subscribers as possible within the finite frequency resources allocated to the system. In this portable phone, the magnitude of transmission output power is determined by the distance and the electrical communication environment between the transmitter and the receiver. More specifically, explanation will be made with reference to an example of the cellular telephone system emphasizing a given base station as shown in FIG. 10. In the communications between the base station 103 and a portable phone set 101 similar to each other in the electrical communication environment, the transmission power is reduced as needed. In the case of a portable phone set 102 which is located at a long distance from the base station 103, on the other hand, the communication power between the base station 103 and the portable phone 102 is increased. As a result, the control of the transmission output power within the range of about 20 dBm, for example, is required for the transmitters 101, 102. The level of transmission power used by the transmitters 101, 102 for transmission is selected by the signal, i.e., the instruction on the transmission power information contained in the received signal sent from the base station. This control of transmission power is intended to minimize the effect of unnecessarily large transmission power on the devices used for communications in other cells with a relatively short distance between the transmitter and the receiver, to minimize the consumption of the power battery of the transmitter due to unduly large transmission power and to thereby lengthen the communication time with a limited battery capacity. This control of transmission power is described in JP-A-3-229526 laid open Oct. 11, 1991 and JP-A-4-37323 laid open Feb. 7, 1992.

The above-mentioned control of transmission power can be easily realized by controlling the gain of the radio-frequency power amplifier of the transmitter. The inventors, however, have discovered that the mere gain control of the output power makes it difficult to attain compatibility between the linearity of the amplifier during a small output power and that during a large output power due to the fact that the input signal power of the radio-frequency power amplifier is fixed, and therefore the modulation output signal is liable to interfere with adjacent channels.

In other words, in cellular telephone systems, it is necessary to prevent interference with adjacent channels by narrowing the bandwidth of a given transmission signal (a given modulation signal). For this purpose, the format of the frequency spectrum representing the distribution of the signal power of each frequency and the frequency of the side lobes about the carrier frequency is specified as shown in FIG. 11A. The transmission signal is required not to exceed the upper-limit power level specified by this format. A modulation system convenient for reducing the interference with adjacent channels includes the GMSK (Gaussian Minimum Shift Keying) or the π/4-shift QPSK. Further, in order to satisfy the specification of the frequency spectrum, the radio-frequency power amplifier is required to have a linearity of output power with respect to input power within the operating power range.

It is, however, difficult to secure sufficient linearity over the whole range of operating power due to the non-linear characteristic of the semiconductor devices during small power output. As shown in FIG. 12, for example, when the gate-source voltage Vgs is comparatively small, the relation between the gate-source voltage Vgs and the drain current Id of a MOS transistor is extremely nonlinear (class-B amplification). Assume that the gain of the radio-frequency power amplifier is to be controlled by controlling the gate bias voltage of the MOS transistor. When an attempt is made to produce a small power by reducing the gate bias voltage of the MOS transistor, the output signal waveform is distorted with the arrival of an input signal to the particular gate. This distortion displaces the transmission signal from the frequency spectrum specification.

An amplitude-modulation output in percent making up one of the parameters for evaluating the amplification linearity is shown in FIG. 13. The characteristic shown in FIG. 13 is obtained by applying a 915-MHz transmission wave signal subjected to 10-KHz 5% amplitude modulation to a radio-frequency power amplifier made up of a silicon MOS transistor, producing the desired gain of the output power by regulating the voltage at the gain control terminal of the particular amplifier, and measuring the proportion of the 10-KHz amplitude modulation component contained in the output power, as shown in FIG. 14. Compare, for example, the class-B amplification with a reduced gate bias voltage with the class-A amplification with an increased gate bias voltage (FIG. 12). With the class-A amplification, the drain current flows over the whole period of input, and therefore, the modulation component occupying the amplified output amplitude is reduced, i.e., the distortion of the amplified modulation signal is reduced as compared with the class-B amplification. This is clearly indicative of the fact that the distortion of the modulation signal is increased with the value of the amplitude modulation output in percent. The inventors discovered that a large amplitude modulation output in percent is equivalent to the existence of many frequency components displaced from the frequency spectrum specification. This is clearly indicated by the trend shown in FIG. 11B. The larger the amplitude modulation output in percent, the output power for the spectrum expansion is undesirably larger. In FIG. 13, the input signal power corresponding to 3 dBm and −3 dBm (dBm should be understood to be a symbol representing the absolute value of decibel with the output power of 1 milliwatt as 0 dBm) are typically shown. In order to satisfy the specification of the frequency spectrum, etc. of the portable phone, the parameters including the amplitude modulation output in percent must be less than a predetermined operating limit within the operating range of transmission power (15 dBm to 35 dBm in the case of FIG. 13). The inventors, however, have found that the specification fails to be met in the hatched portion of the diagram. According to FIG. 13, in the case where the input signal power is fixed to 3 dBm with a comparatively small output power (with a small gate bias voltage and a small power amplification factor of the MOSFET), the waveform was found to be distorted. Nevertheless, an attempt to improve the amplitude modulation output in percent by unduly reducing the input signal power of the radio-frequency power amplifier to, say, −3 dBm as shown in FIG. 13 would fail to produce output power of a magnitude required from the critical gain of the radio-frequency power amplifier.

As explained above, in a modulation scheme using a small to large transmission power and having a transmission signal requiring the amplification linearity, a configuration in which the gain of the radio-frequency power amplifier is changed to produce a desired output power by fixing the input signal power generally fails to secure a sufficient linearity for the power amplification system as a whole due to the nonlinear characteristic of the semiconductors during a small power output. A technique for controlling the gain of the power amplifier is disclosed in U.S. Pat. No. 5,307,512 issued Apr. 26, 1994 to Mitzlaff. This patent is directed to improve a dynamic range of power amplification.

SUMMARY OF THE INVENTION

An object of the present invention is to provide a mobile communication apparatus and method which is capable of maintaining the linearity during a small power output similar to the linearity during a large power output for a radio-frequency power amplifier.

Another object of the present invention is to provide a mobile communication apparatus and method which is capable of preventing the likelihood of interference of the modulation output signal with adjacent channels in a digital modulation method having a comparatively wide range of output power and requiring the linearity of a radio-frequency amplification section.

Still another object of the present invention is to provide a mobile radio apparatus and communication method for digital communication capable of high-quality communications.

Representative forms of the invention disclosed by the present application will be briefly described.

A mobile radio communication apparatus including a radio-frequency power amplifier for power-amplifying the modulation signal for controlling the transmission power, further comprises means for reducing the signal power input to a radio-frequency power amplifier on the basis of the fact that the instruction, i.e., the transmission power information contained in the received signal wave arriving from an external unit such as a base station is an instruction for reducing the relative magnitude of the output power of the radio-frequency power amplifier, for example, to a value less than a predetermined transmission power level, and means for increasing the gain of the radio-frequency power amplifier in response to the reduced input signal power from the input signal power reduction means.

The input signal power reduction means includes an attenuator arranged in the output stage of input means, i.e., a modulator of the radio-frequency power amplifier. Alternatively, the input signal power reduction means includes a preamplifier for reducing the output power of the modulator in advance and power-amplifying the output of the modulator according to the transmission power information.

The transmission power control circuit for controlling the increase and decrease of the transmission power in accordance with the communication environment including the communication distance includes control means for selecting and specifying the output power of the radio-frequency power amplifier from a plurality of output levels in accordance with the instruction contained in the received signal arriving from an external source, means for detecting the output power of the radio-frequency power amplifier, and transmission power control means for controlling the gain of the radio-frequency power amplifier in such a manner that the power detected by the detector means coincides with the power associated with the instruction from the control means. These means constitute means for increasing the gain.

A mobile communication apparatus according to another specific example of the invention comprises an antenna, a radio-frequency receiving circuit for demodulating the signal received from the antenna, a modulator for modulating the transmission signal to be transmitted from the antenna, a radio-frequency power amplifier for oscillating the antenna on the basis of the output of the modulator, a transmission power detector for detecting the output power of the radio-frequency power amplifier, a transmission power control circuit for forming a control voltage for the radio-frequency power amplifier in such a manner that the power detected by the transmission power detector coincides with the power to be transmitted, and a data processing unit for applying an instruction on the transmission power level to the transmission power control circuit in accordance with the signal instruction contained in the received wave arriving from an external source. The apparatus according to the invention further comprises means for reducing the input signal power of the radio-frequency power amplifier in response to the instruction from the data processing unit that the power to be transmitted applied to the transmission control circuit should be lower than a predetermined power level, at least a MOS transistor circuit constituting the radio-frequency power amplifier, and bias control means included in the transmission power control circuit for controlling the gate bias of the MOS transistor amplifier in response to the instruction that the power to be transmitted should be lower than the predetermined power level. The signal power reduction means includes an attenuator for attenuating and outputting the power of the modulation signal to the radio-frequency power amplifier in accordance with the control signal supplied from the data processing unit or a preamplifier for power-amplifying and outputting the modulation signal to the radio-frequency power amplifier with a gain corresponding to the control signal supplied from the data processing unit.

In the above-mentioned configuration of the mobile communication apparatus, the input signal power to the radio-frequency power amplifier is reduced during a predetermined small power output, and the transmission output power which tends to decrease is compensated for by increasing the gain of the radio-frequency power amplifier. Under this condition, the radio-frequency power amplifier is operable in a linear region of the operating characteristic of the transistor similar to the region for a high power output. As a consequence, the linearity of the amplification operation of the radio-frequency power amplifier is achieved even during small power output. In other words, the linearity of the amplifier over the whole operating range of the transmission power is guaranteed. The modulation output signal produced when employing a digital modulation scheme having a relatively wide range of output power and requiring the linearity of a radio-frequency amplifier is thus prevented from interfering with adjacent channels.

In the case where an attenuator is employed as a means for reducing the modulation signal output, as illustrated in FIGS. 4A and 4B, the attenuation factor of the attenuator is increased when the output power of the radio-frequency power amplifier is to be decreased below a predetermined power level. In the case where a preamplifier is employed, on the other hand, as shown in FIGS. 9A and 9B, the power amplification factor of the preamplifier is decreased when reducing the output power of the radio-frequency power amplifier 11 below a predetermined power level. The output power of the modulator is increased relatively for the former and decreased relatively for the latter case. The former method simplifies the circuit configuration more from the viewpoint of impedance matching and linearity.

In the case where the output power according to the instruction from the control means or the data processing unit is required to be output by the radio-frequency power amplifier, the feedback system comprising the transmission power detection circuit and the transmission power control circuit autonomously controls the power amplification factor upward when the input signal power is decreased, and vice versa. This transmission power control system may inherently be a circuit for controlling the transmission power by selecting the optimum transmission power from a plurality of levels in accordance with the communication environment including the communication distance in compliance with the signal instruction contained in the wave received from the base station. The transmission power control system, however, has also the function of increasing the power amplification gain of the radio-frequency power amplifier when the input signal power of the radio-frequency power amplifier is reduced through an attenuator or a preamplifier. Consequently, in a mobile communication apparatus comprising a transmission power control system as described above, the linearity of the amplification operation of the radio-frequency power amplifier can be guaranteed over the whole operating range of the transmission power simply by adding a circuit for selectively reducing the input power to the radio-frequency power amplifier.

The above and other objects, features and advantages will be made apparent by the detailed description taken in conjunction with the accompanying drawings.

BRIEF DESCRIPTION OF THE DRAWINGS

FIG. 10 is a schematic diagram for explaining a cellular telephone system.

DESCRIPTION OF THE PREFERRED EMBODIMENTS

Figure 1:
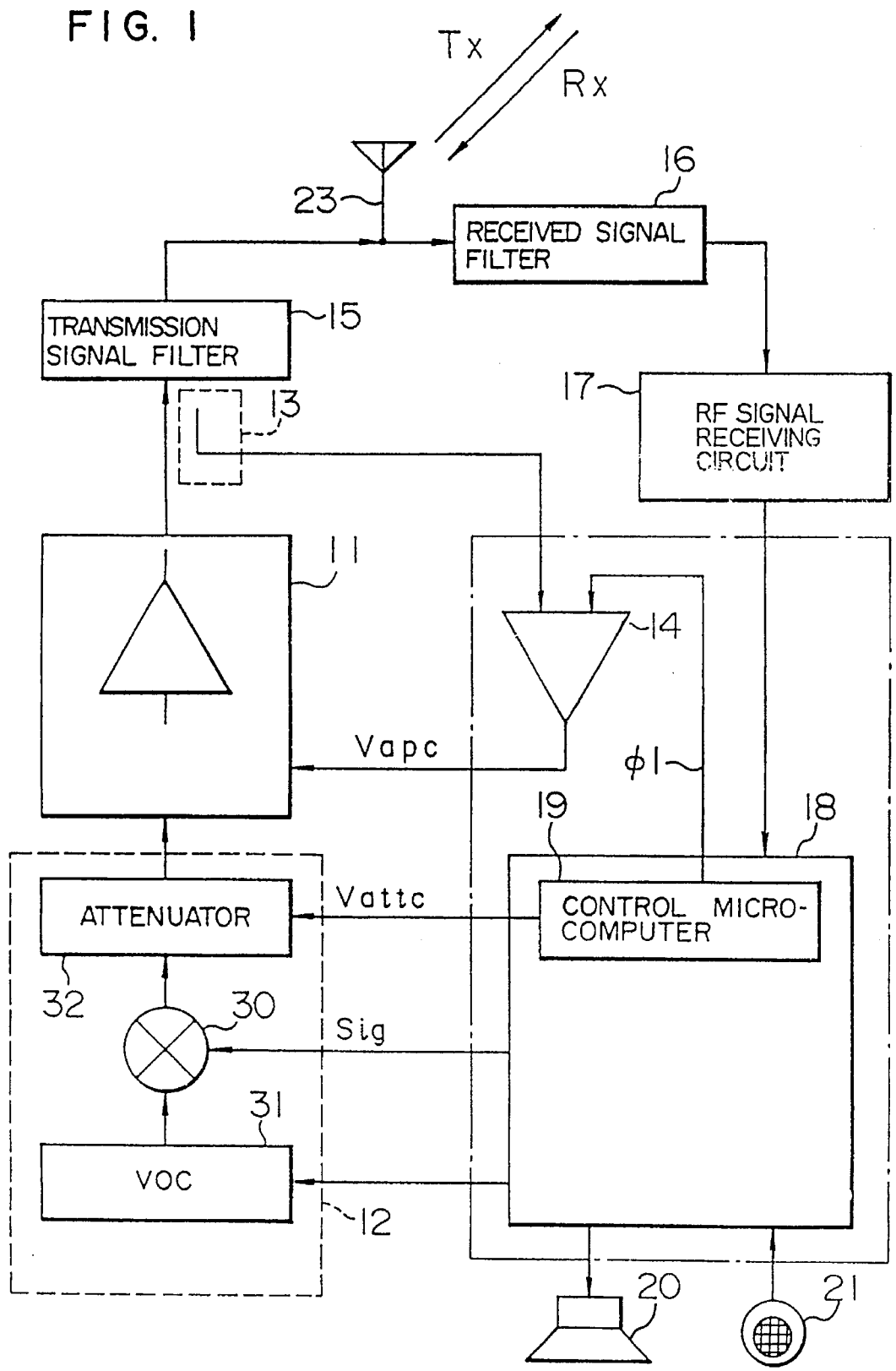
FIG. 1 is a block diagram showing a portable phone set according to an embodiment of the invention.

A block diagram of a portable phone set according to an embodiment of the invention is shown in FIG. 1. First, this embodiment will be briefly explained with reference to FIG. 1.

In FIG. 1, a base-band unit 18 suppresses and converts into a digital signal the radio-frequency noise component of the transmission analog voice signal input from a microphone 21. The resulting digital signal is band-compressed by digital signal processing. Also, the received digital signal band-compressed is expanded into the original bandwidth and converted into an analog voice signal by digital signal processing. In this way, the high-harmonic components contained in the signal is suppressed, and the resulting signal is amplified thereby to drive a speaker 20.

A modulation circuit 12 includes a modulator 30 for modulating the transmission signal Sig output from the base-band section 18 in a manner suitable for radio transmission such as GMSK or π/4-shift QPSK. The modulator 30, though not limited specially, is supplied with a carrier wave from a voltage-controlled oscillator (VCO) 31. Further, as described in more detail later, the output power of the modulator 30 is selectively attenuated by an attenuator 32 and applied to a radio-frequency power amplifier 11. When power for the portable phone set is switched on, a code number or identification number specific to the telephone set is registered with a host system (not shown) for mobile telephone through the nearest base station. The host system allocates a frequency to the portable phone set thus registered and informs the portable phone set of the allocated frequency through the nearest base station. The portable phone set generates a carrier corresponding to the allocated frequency in a voltage-controlled oscillator 31, in response to which the modulator 30 modulates the transmission signal Sig.

The radio-frequency power amplifier 11 amplifies the signal output from the attenuator 32 to a predetermined transmission power level. The signal thus amplified oscillates an antenna 23 through a transmission signal filter 15 such as a bandpass filter, and thus a transmission signal Tx is sent out.

The signal Rx received from the antenna 23 is applied to a radio-frequency receiving circuit 17 through a received signal filter 16 such as a bandpass filter. The radio-frequency receiving circuit 17 amplifies the received signal while at the same time detecting a desired signal, demodulating the original basic signal component from the received modulation signal and applying the demodulated signal to the base-band section 18. It should be understood that a dial signal generator, a call signal generator, a control microcomputer 19 and a clock signal generator, etc. are included in the circuit block of the base-band section 18. The portable phone set also includes a keypad not shown and a power circuit with a battery as a power supply.

According to this embodiment, the output power of the radio-frequency power amplifier 11 is controlled by feedback through a loop of the transmission power detection circuit such as a coupler 13 and the transmission power control circuit 14. The input power level to the radio-frequency power amplifier 11 is controlled by the attenuator 32. The amount of control is determined by the control microcomputer 19 in accordance with the instruction contained in the signal wave received from the antenna 23, i.e., the transmission power control information based on the electrical and communication-environmental conditions between the base station and the particular portable phone set as determined by the base station. These power control operations will be described in detail.

First, reference is made to the output power control of the radio-frequency power amplifier 11, i.e., transmission power control. The transmission power detection circuit 13 makes up a coupler for detecting the transmission power by electromagnetic induction or the like with the output of the radio-frequency power amplifier 11. The resulting detection signal is applied to the transmission power control circuit 14, which is supplied with an instruction signal φ1 of transmission power level from the control microcomputer 19. The transmission power level specified by the instruction signal φ1, though not specially limited, can be divided into a plurality of different levels including, for example, 20 W, 8 W, 5 W, 2 W and 0.8 W. More specifically, the transmission power control circuit 14 includes a comparator circuit such as an operational amplifier. One input to the comparator circuit is supplied with an analog signal from the coupler 13, and the other input of the comparator receives the instruction signal φ1 making up an analog signal associated with the selected transmission power level. As a consequence, the transmission power control circuit 14 controls the gain of the radio-frequency power amplifier 11 in such a manner that the transmission power output from the radio-frequency power amplifier 11 coincides with the level specified by the instruction. For example, the range of 15 dBm to 35 dBm is divided into a plurality of levels to control the gain of output power. The level of transmission power actually used is selected in accordance with the signal instruction (transmission power control information) contained in the signal wave received from the base station or the like. For example, the base station supplies the transmission power control information relating to proper transmission power to the control microcomputer 19 from the antenna 23 by determining the electrical or communication-environmental conditions. On the basis of this information, the control microcomputer 19 specifies a transmission power level to the transmission power control circuit 14 using the instruction signal φ1. Further, in view of the fact that the transmitting operation for the digital transmission scheme can be implemented by time-division multiplexing, the gain of the amplifier 11 is controlled so that the rise waveform in the beginning of transmission can also be specified. The waveform control required for this operation, as well as the specification of the transmission power, is performed on the transmission power control circuit 14 by the microcomputer 19.

Figure 2:
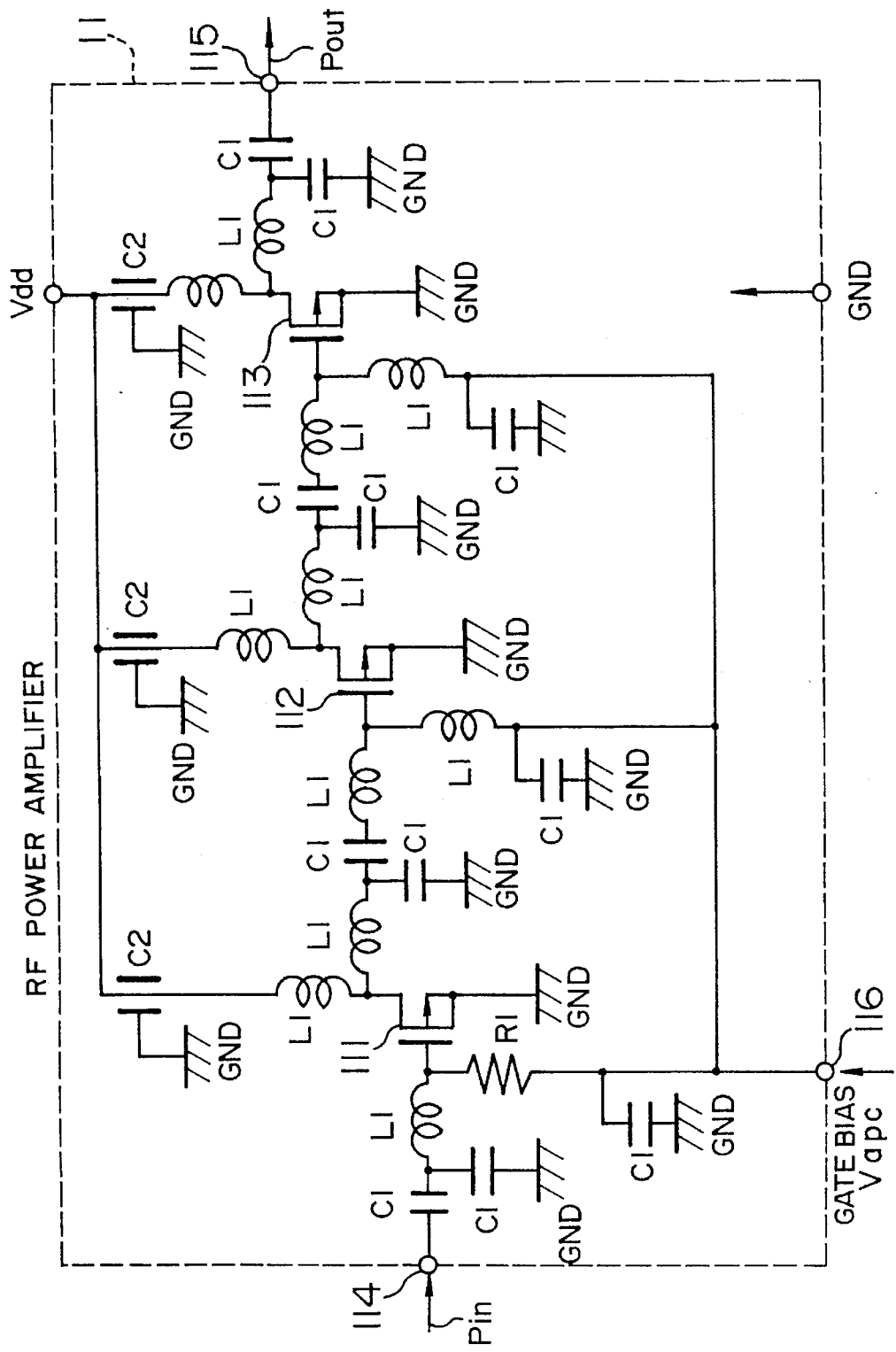
FIG. 2 is a circuit diagram showing a MOS transistor of an example radio-frequency power amplifier according to the embodiment of FIG. 1.

An example of the radio-frequency power amplifier 11 is shown in FIG. 2. The radio-frequency power amplifier 11, though not limited specially, includes power MOSFETs 111 to 113 cascaded in three stages with the drain of the power MOSFET of each stage connected to the gate of the power MOSFET of the next stage. These power MOSFETs 111 to 113 share a power supply that is a first source voltage Vdd, the ground that is a second source voltage GND and a power control voltage Vapc. The radio-frequency amplifier 11 including poert MOSFETs may be of for example; Hitachi's product, type PF0120, PF1030, PF1040 or PF1050 module. The gate of the power MOSFET 111 in the first stage is connected to an input terminal 114 supplied with a modulated radio-frequency signal (radio-frequency input signal) Pin of comparatively low power from a modulation circuit 12. The drain of the power MOSFET 113 in the last stage is connected to an output terminal 115 of a power-amplified radio-frequency signal (radio-frequency output signal) Pout. The gates of the power MOSFETs 111 to 113 are connected to a control terminal 116 impressed with the power control voltage Vapc. A capacitor C1, an inductor L1 and a resistor R1 arranged in each stage of the power MOSFET circuits are inserted for securing the impedance matching between the respective stages of the power MOSFETs 111 to 113. A feed-through capacitor C2 Commonly used for preventing wave leakage protects the radio-frequency components from leaking to the power supply Vdd. The power control voltage Vapc is a DC voltage supplied from the power control circuit 14 and is used as a gate bias voltage for the power MOSFETs 111 to 113. The power of the radio-frequency output signal Pout increases with the gate bias voltage. The transmission power control circuit 14 outputs the power control voltage Vapc of an analog level capable of securing the transmission power level notified by the control signal φ1 from the control microcomputer 19. As a result, in the case where the radio-frequency power amplifier 11 produces a predetermined output power corresponding to the instruction signal φ1, the feedback control system including the transmission power detection circuit 13 and the transmission power control circuit 14 controls the power control voltage Vapc autonomously in such a way that the power amplification factor increases with the decrease of the input signal power and decreases with the increase of the input signal power.

Figure 3A:
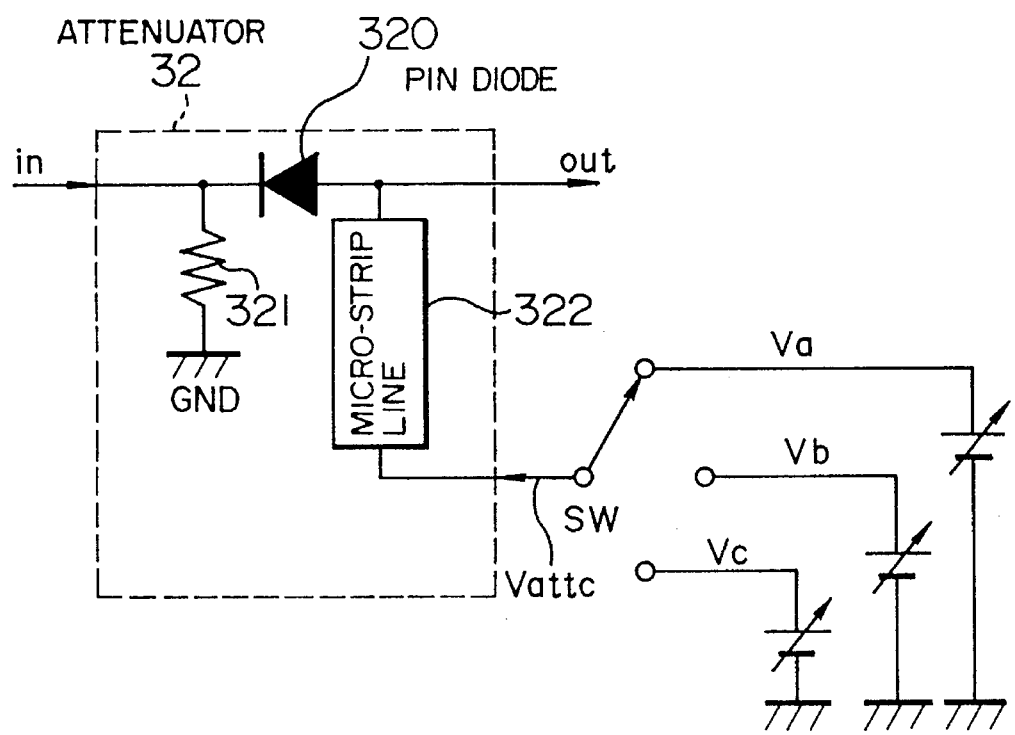
FIGS. 3A, 3B are diagrams showing the circuit configuration of an example attenuator and the operating characteristics of the attenuator, respectively, according to the embodiment of FIG. 1.
Figure 3B:
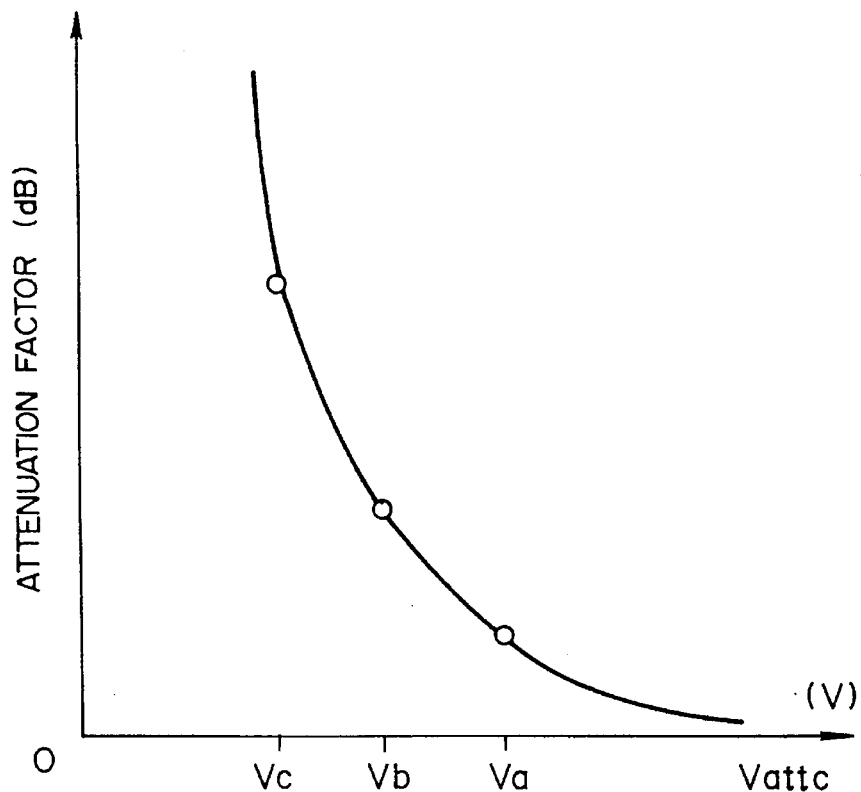

FIG. 3A shows an example configuration of the attenuator 32. The input power control of the radio-frequency power amplifier 11 will be explained with reference to FIG. 3A. The attenuator 32 includes a PIN diode 320 with the cathode connected to the input ("in") and the anode connected to the output ("out"). The cathode of the PIN diode 320 is coupled to the ground GND through a resistor 321. The anode of the PIN diode 320 is supplied with a control voltage Vattc through a micro-strip line 322. Three representative voltages Va, Vb, Vc (Va>Vb>Vc) are shown as the control voltage Vattc in FIG. 3A. The PIN diode 320 is capable of changing the radio-frequency series resistance component of a forward DC current while maintaining the signal linearity by the use of the particular forward DC current. The lower the control voltage Vattc, therefore, the larger the extent to which the signal power level can be attenuated. This fact is illustrated by the relation between the voltages Va, Vb, Vc and the attenuation factor in FIG. 3B.

Figure 4A:
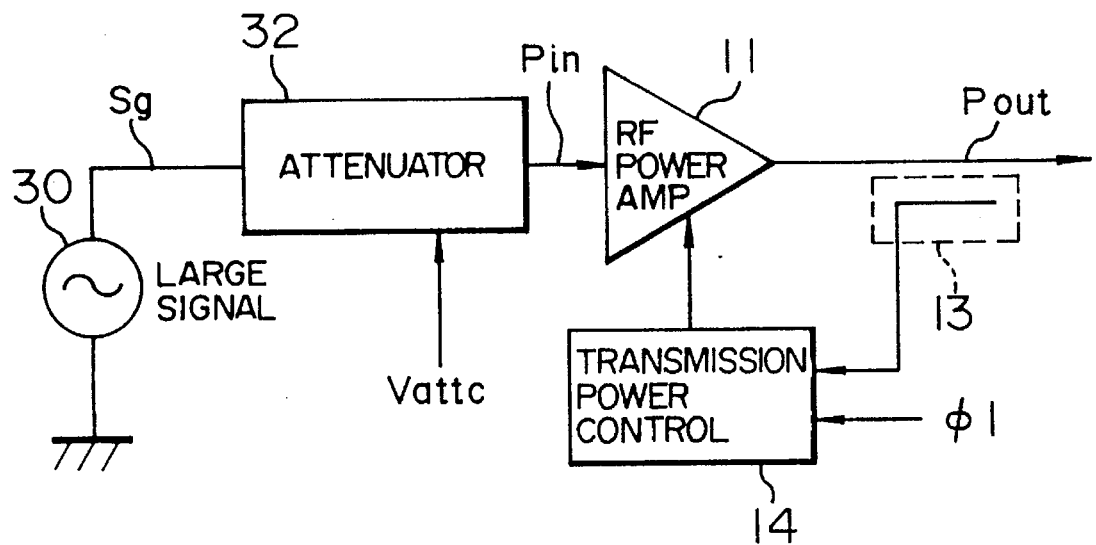
FIGS. 4A, 4B are a block diagram and a diagram for explaining the operating characteristics, respectively, of the essential parts of the embodiment of FIG. 1, in which the output power of a radio-frequency power amplifier is controlled by feedback through a loop of a transmission power detection circuit and a transmission power control circuit, and the input power to the radio-frequency power amplifier is controlled by an attenuator.
Figure 4B:
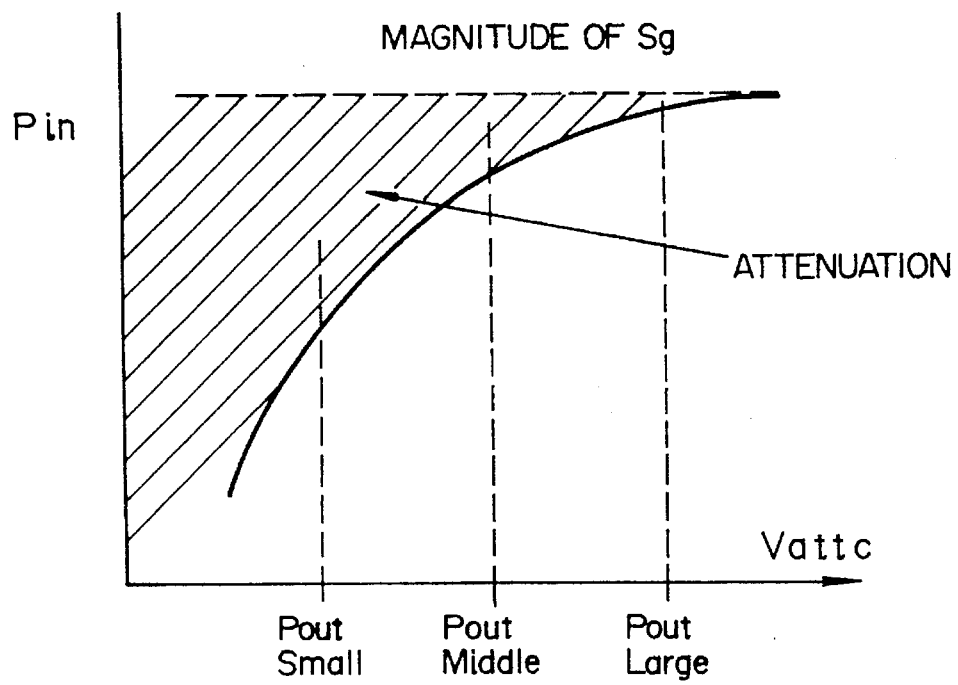

In the case where the transmission power level specified by the instruction to the transmission power control circuit 14 from the control microcomputer 19 is lower than a predetermined level (such as when the transmission power level of 0.8 W is specified), the control microcomputer 19 instructs the attenuator 32 to attenuate the input signal power to the radio-frequency power amplifier 11 by reducing the control voltage Vattc in accordance with the instruction. In other words, the control microcomputer 19 in the base-band section 18 detects the transmission power level specifying signal contained in the wave signal received from the base station or the like, and applies an instruction specifying the particular transmission level to the transmission power control circuit 14. At the same time, in the case where the transmission level is lower than the predetermined level, the control microprocessor 19 reduces the control voltage Vattc to specify a relatively large attenuation factor to the attenuator 32, thereby attenuating the input signal power to the radio-frequency power amplifier 11. More specifically, as shown illustratively in FIG. 4A, in the case where the power of the radio-frequency output signal Pout of the radio-frequency power amplifier 11 is to be reduced, the attenuation factor of the attenuator 32 is increased thereby to reduce the power of the input signal Pin of the radio-frequency power amplifier 11. With the decrease of the power of the input signal Pin, the transmission power control circuit 14 increases the control voltage Vapc of the radio-frequency power amplifier 11 in order to produce a predetermined transmission power specified by the control signal φ1, thereby increasing the power amplification factor of the radio-frequency power amplifier 11. This control operation is autonomously performed through a feedback loop system including the transmission power detection circuit 13 and the transmission power control circuit 14 as described above. In FIG. 4B, Sg designates an output signal of the modulator 30.

Figure 12:
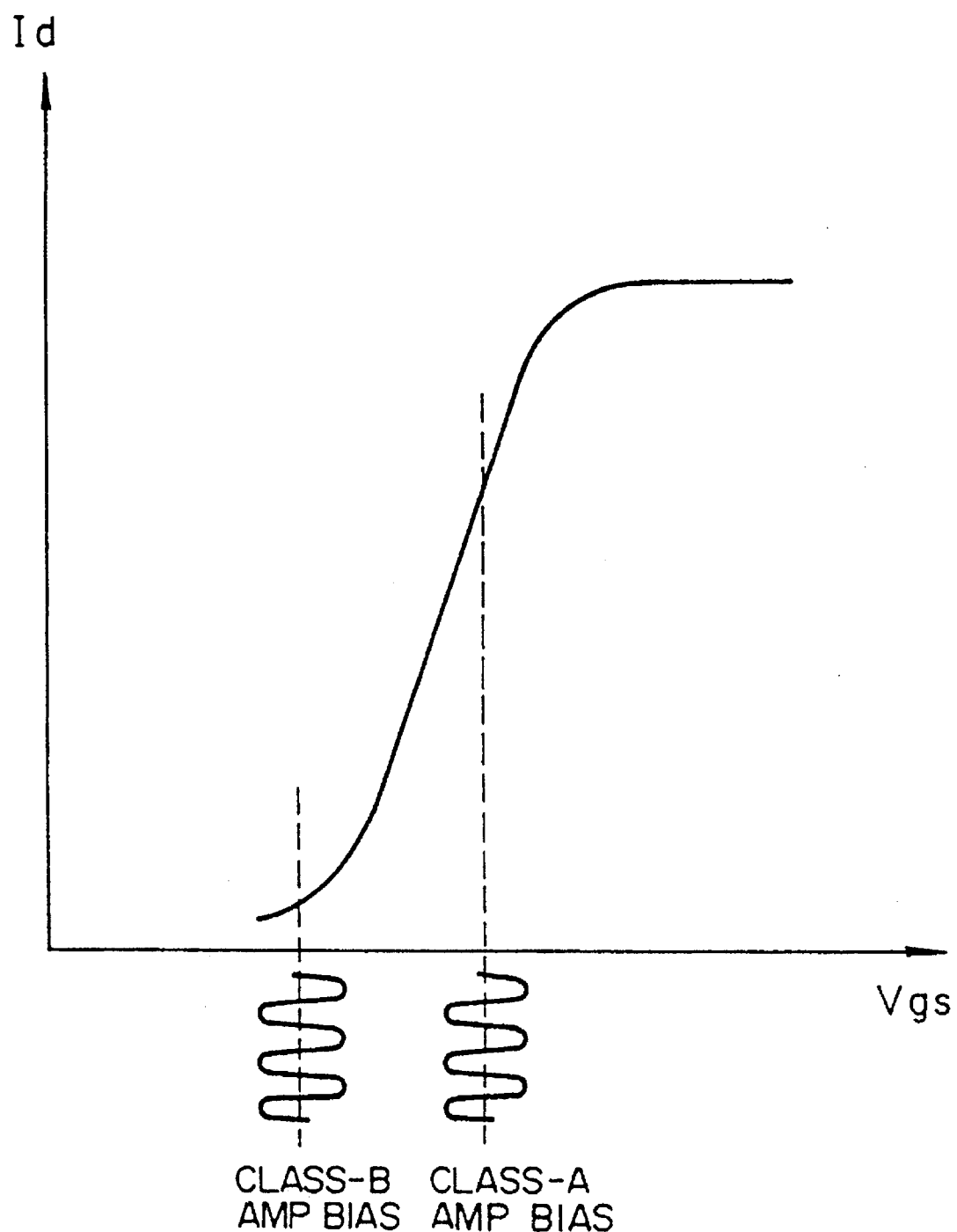
FIG. 12 is a diagram showing an example Vgs-Id characteristic of the MOS transistor.
Figure 13:
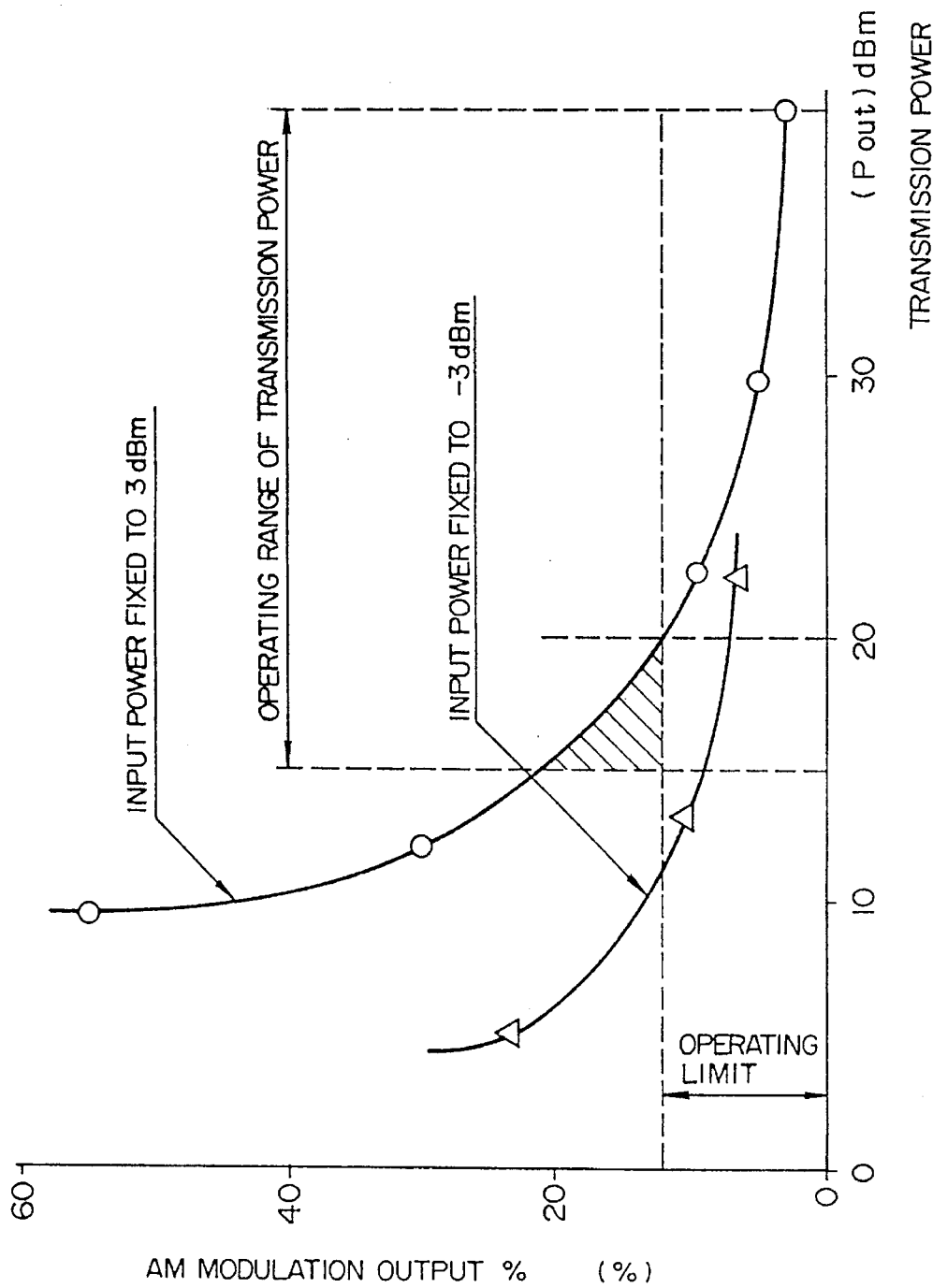
FIG. 13 is a characteristic diagram showing an example of evaluation of the operating distortion of the radio-frequency power amplifier in terms of amplitude modulation output in percent.
Figure 14:
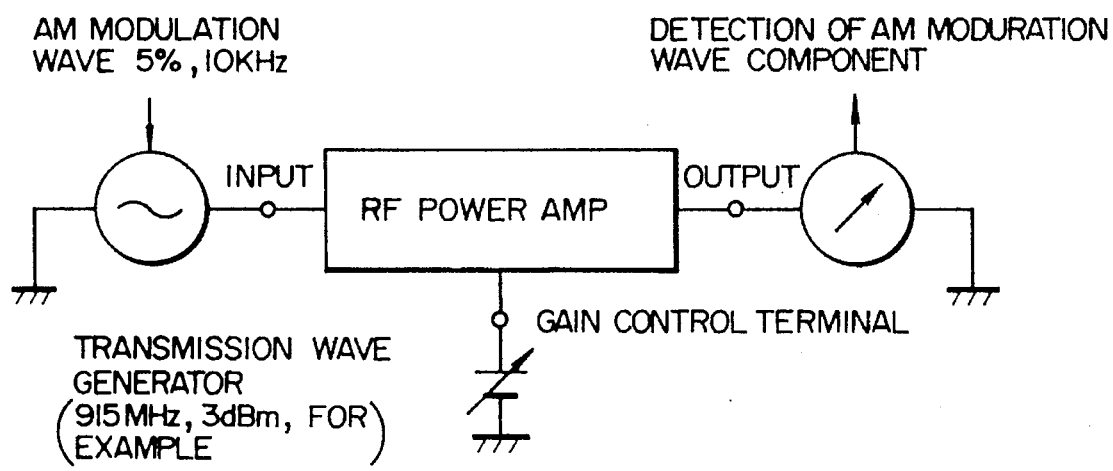
FIG. 14 is a model diagram schematically showing the manner in which measurements are taken in FIGS. 6 and 13.

In the case where the power amplification factor of the radio-frequency power amplifier 11 is to be reduced, the gate bias voltage of the power MOSFET supplied by the control voltage Vapc is set to a relatively low level. As a result, the operation of the power MOSFET occurs in a nonlinear region as shown in FIG. 12, accompanied by a large distortion. If the input signal power of the radio-frequency power amplifier 11 is decreased under this condition, the radio-frequency power amplifier 11 is required to operate with a large power amplification factor in order to secure a predetermined output power level. In other words, the control voltage Vapc supplied through the feedback control system is increased, with the result that the gate bias voltage of the power MOSFETs 111 to 113 is increased, thereby realizing the operation occurring in a linear region, i.e., a region with a small distortion as shown in FIG. 12. Thus the linearity of the amplification operation of the radio-frequency power amplifier 11 can be guaranteed even with a small transmission power.

Figure 5:
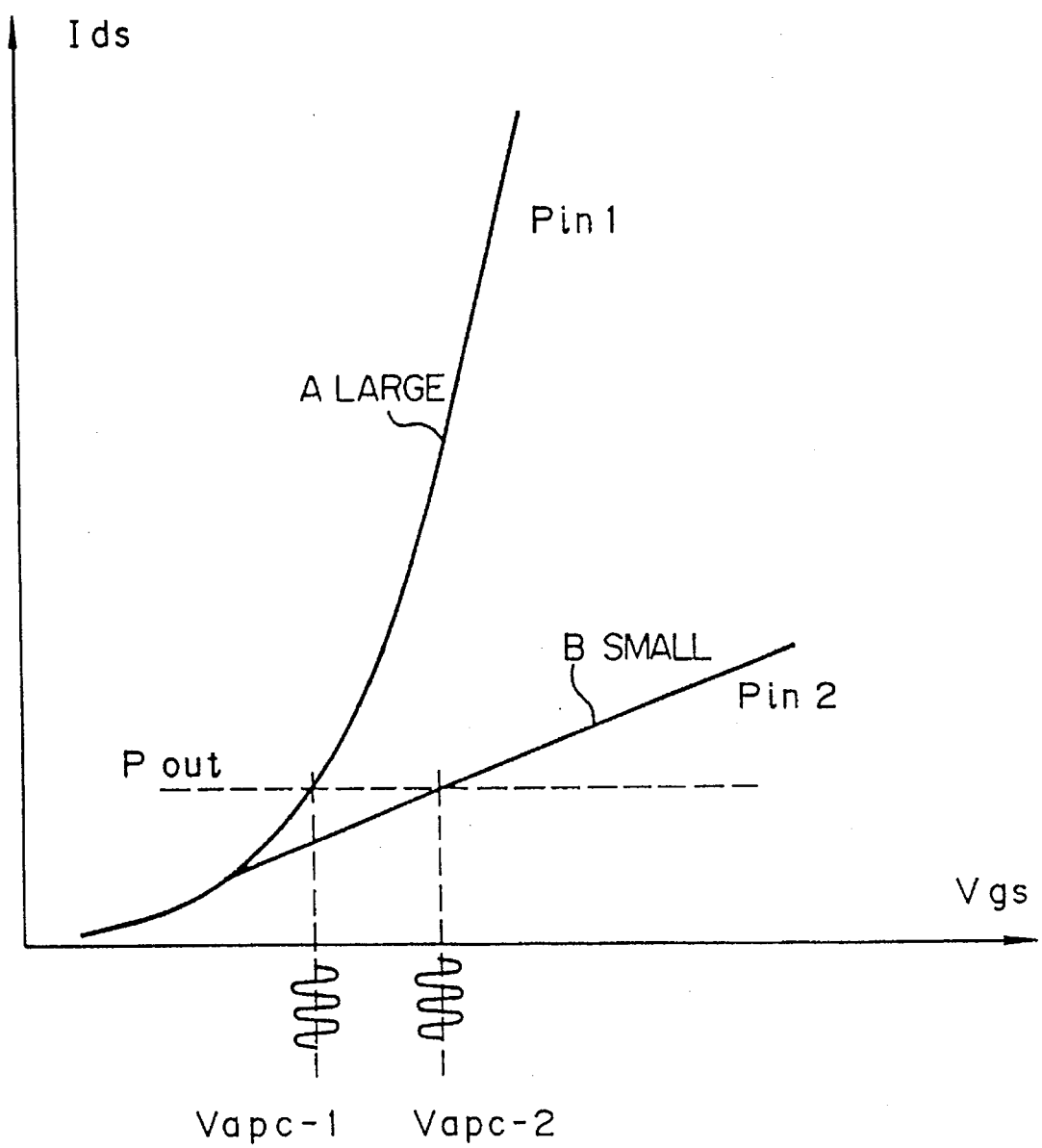
FIG. 5 is a diagram for explaining the Vgs-Id characteristic of the whole of a power MOSFET in three-stage cascade with a relatively large control voltage and a relative small control voltage applied to produce a predetermined power as the output signal of the radio-frequency power amplifier.

The general Vgs-Id characteristic of the power MOSFETs 111 to 113 connected in three-stage cascade is shown in FIG. 5 for the cases where a relatively large control voltage Vapc1 and a relatively small control voltage Vapc2 are applied in order to secure a predetermined power level of the radio-frequency output signal Pout in the radio-frequency power amplifier 11. In FIG. 5, the power to be secured of the radio-frequency output signal Pout is assumed to be a relatively small power level (say, 0.8 W) in the transmission power stages (including, for example, 20 W, 8 W, 5 W, 2 W, 0.8 W). Assume that the input signal is Pin1 when the input power is not reduced by the attenuator 32, and Pin2 when the input power is reduced by the attenuator 32. When a predetermined power level is produced in the radio-frequency output signal Pout with the input signal power not attenuated (Pin1), the power amplification factor of the radio-frequency power amplifier 11 can be comparatively reduced. Therefore, the amplification operation occurs in a nonlinear region as indicated by characteristic curve A. With the attenuation of the input signal power (Pin2), in contrast, a gate bias voltage Vapc2 larger than Vapc1 is applied to the power MOSFETs 111 to 113 in order to secure a predetermined power level in the output signal Pout. The amplification operation thus occurs in a linear region as shown by characteristic curve B. As apparent from this amplification characteristic diagram, the linearity of the amplification operation can be maintained even when the transmission power is small.

Figure 6:
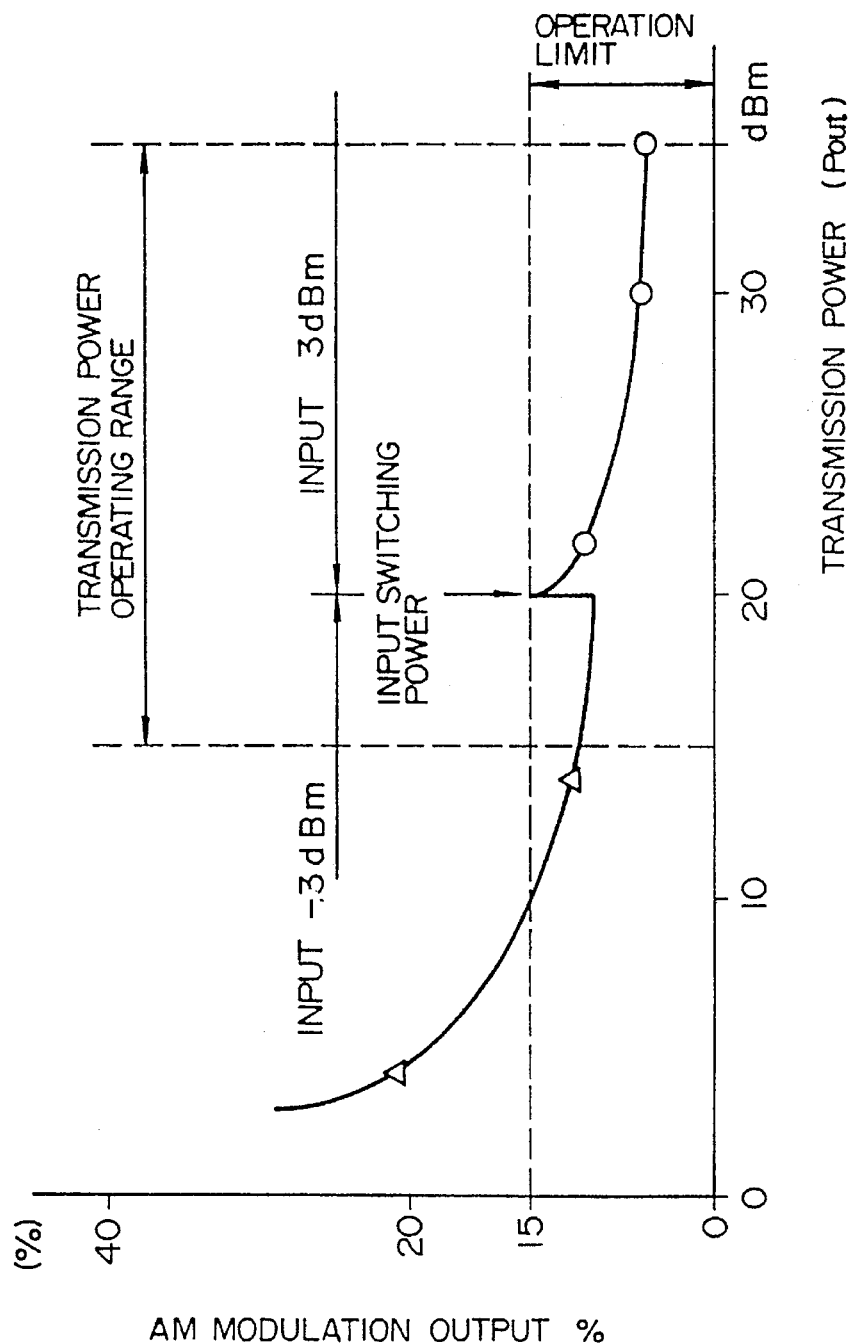
FIG. 6 is a diagram for explaining the amplitude modulation output in percent when the 5% modulation input power to the radio-frequency amplifier is switched between −3 dBm and +3 dBm according to an embodiment of the invention.

The control of the input signal power will be explained with reference to another specific example. As shown in FIG. 6, for example, when the transmission power level of 20 dBm or more is specified, the input signal power is set to 3 dBm. In the case where the transmission power level decreases below the specification, the input signal power is reduced to −3 dBm. In this way, the amplitude modulation output in percent is reduced below the operating limit over the whole transmission power range of 15 dBm to 35 dBm. More specifically, when the input signal power is 3 dBm, the power gain in the vicinity of the lower limit of the operating range of the transmission power is comparatively small. This condition corresponds to the state in which the gate bias voltage of the power MOSFETs 111 to 113 of the radio-frequency power amplifier 11 is low and is associated with a region having a nonlinear relation between the gate-source voltage and the drain current of the MOSFETs 111 to 113. Assume that the input signal power is −3 dBm in this region. The transmission power control circuit 14 controls the gain of the radio-frequency power amplifier 11 upward. This condition corresponds to the state in which the gate bias voltage of the power MOSFETs 111 to 113 of the radio-frequency power amplifier 11 is increased, and is associated with a region where the relation is linear between the gate-source voltage and the drain current of the MOS transistor as shown in FIG. 12. As a result, the linearity of the radio-frequency power amplifier 11 is guaranteed over the whole operating range of the transmission power.

Figure 7:
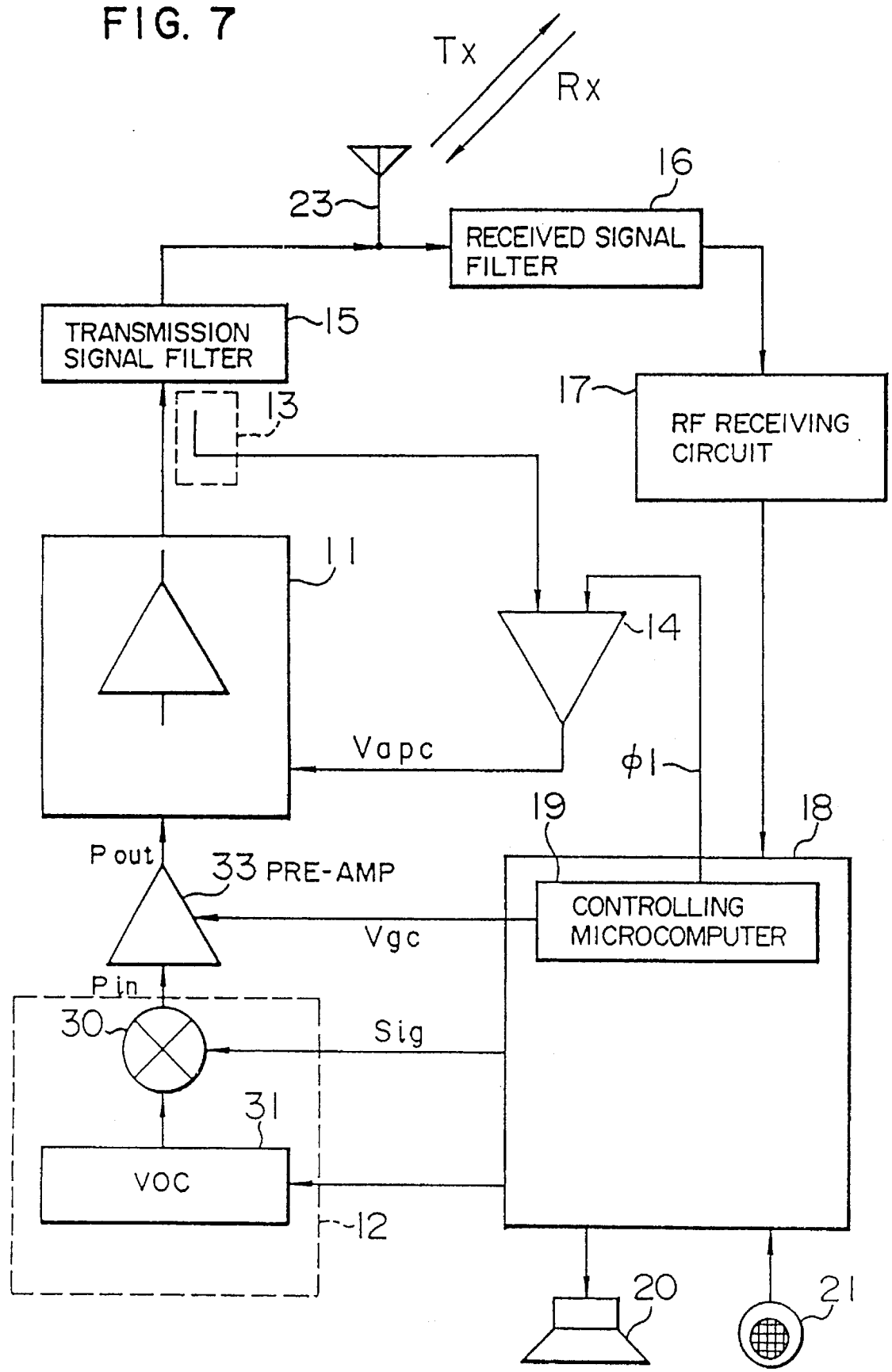
FIG. 7 is a block diagram showing a portable phone set according to another embodiment of the invention.

A block diagram of a portable phone set according to another embodiment of the invention is shown in FIG. 7. The embodiment of FIG. 7 is different from the previously-described embodiment in that in this embodiment the output power of the modulator 30 is reduced in advance and received by a preamplifier 33 in place of the attenuator 32, and that the power amplification factor of the preamplifier 33 is reduced in response to the decrease of the output power of the radio-frequency power amplifier 11. The other parts of the configuration is similar to that of the first embodiment, and the circuit blocks having the same function as in the first embodiment, which are not described again, are designated by the same reference numerals as in the first embodiment respectively.

Figure 8A:
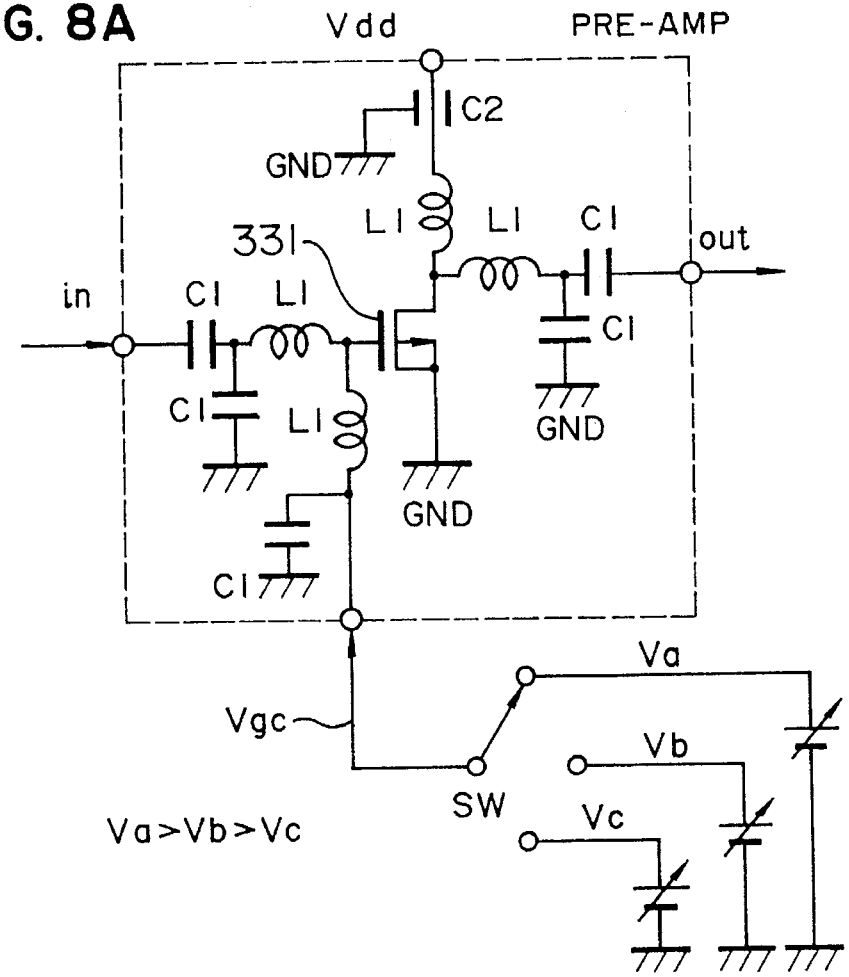
FIGS. 8A, 8B are a circuit diagram and an operating characteristic diagram respectively of an example preamplifier used in the embodiment shown in FIG. 7.
Figure 8B:
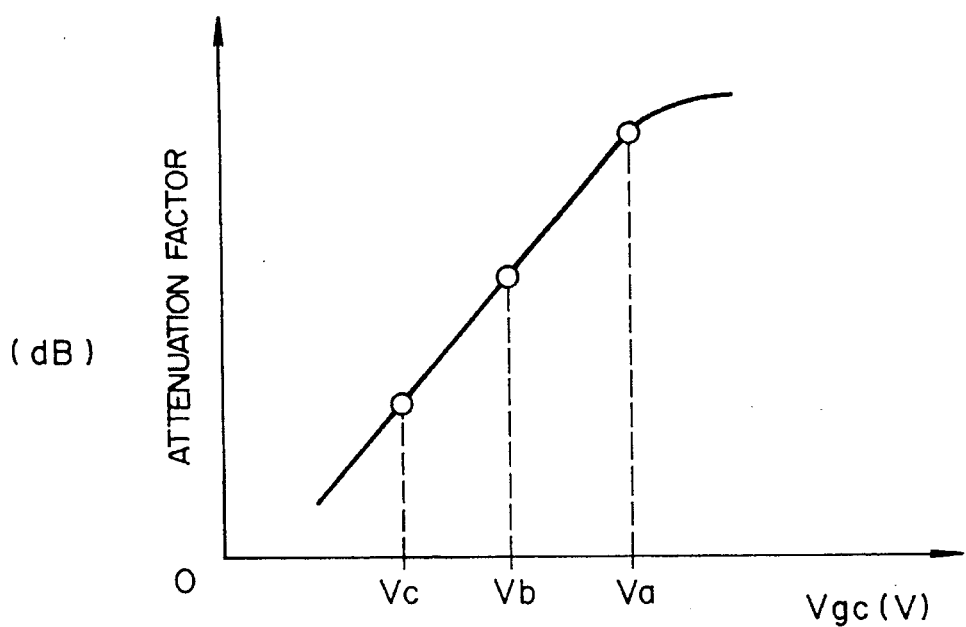

An example of the preamplifier 33 is shown in FIG. 8A. This preamplifier 33 includes a stage of power MOSFET 331 between a power supply Vdd and the ground GND. The gate of the power MOSFET 331 is supplied with the output of the modulator 30, and the drain of the power MOSFET 331 is coupled to the input of the radio-frequency power amplifier 11. The gate of the power MOSFET 331 is impressed with a control voltage Vgc. The capacitor C1 and the inductor L1 arranged at various points of the circuit are for securing the impedance matching in the input and output stages of the power MOSFET 331. A feed-through capacitor C2 is inserted in the route for the power supply Vdd. The control voltage Vgc is a DC voltage and makes up a gate bias voltage for the power MOSFET 331. With the increase in the gate bias voltage, the output signal power also increases. Three representative types of voltage Va, Vb, Vc (Va>Vb>Vc) are shown as the control voltage Vgc in FIG. 8A. The preamplifier 33 is capable of increasing the output signal power with the increase of the gate bias voltage, and also with the increase of the control voltage Vgc. This fact is illustratively demonstrated by the relation between the voltages Va, Vb, Vc and the gain in FIG. 8B.

Figure 9A:
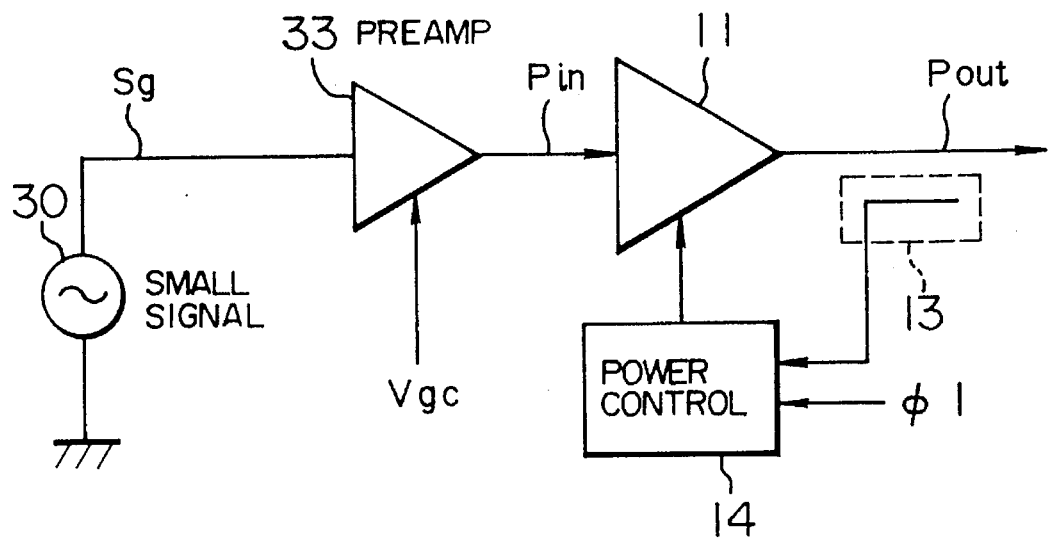
FIGS. 9A, 9B are a block diagram and a characteristic diagram for explaining the operation, respectively, of the essential parts of the embodiment of FIG. 7, in which the output power of the radio-frequency power amplifier is controlled by feedback through a loop of the transmission power detection circuit and the transmission power control circuit, and the input power to the radio-frequency power amplifier is controlled by a preamplifier.
Figure 9B:
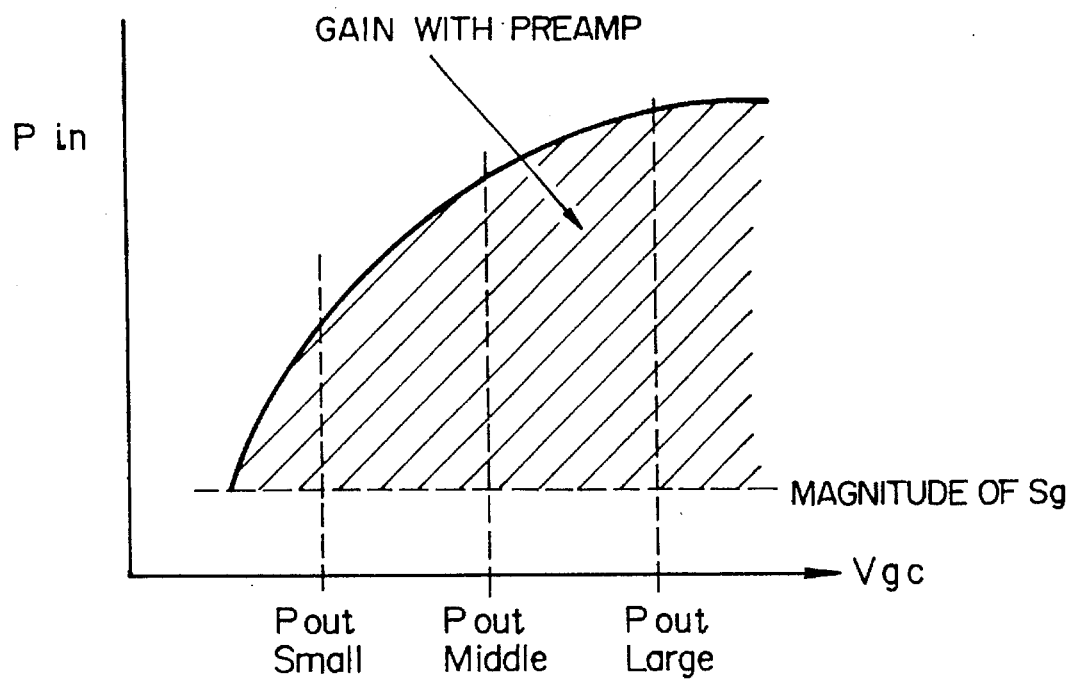
Figure 11A:
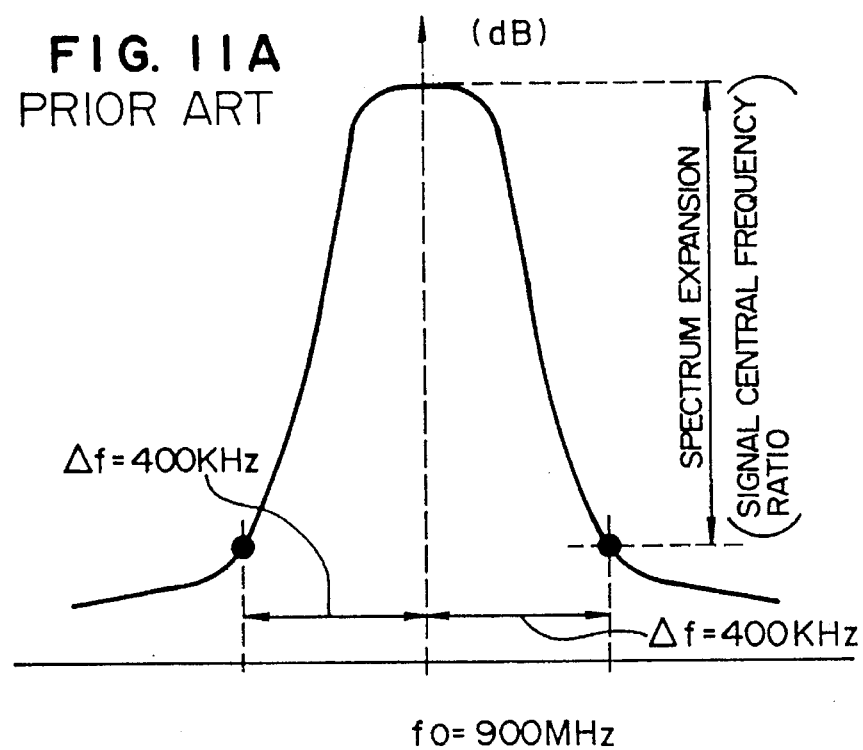
FIGS. 11A and 11B are characteristic diagrams showing an example of relation between the spectrum expansion and the amplitude modulation output in percent.
Figure 11B:
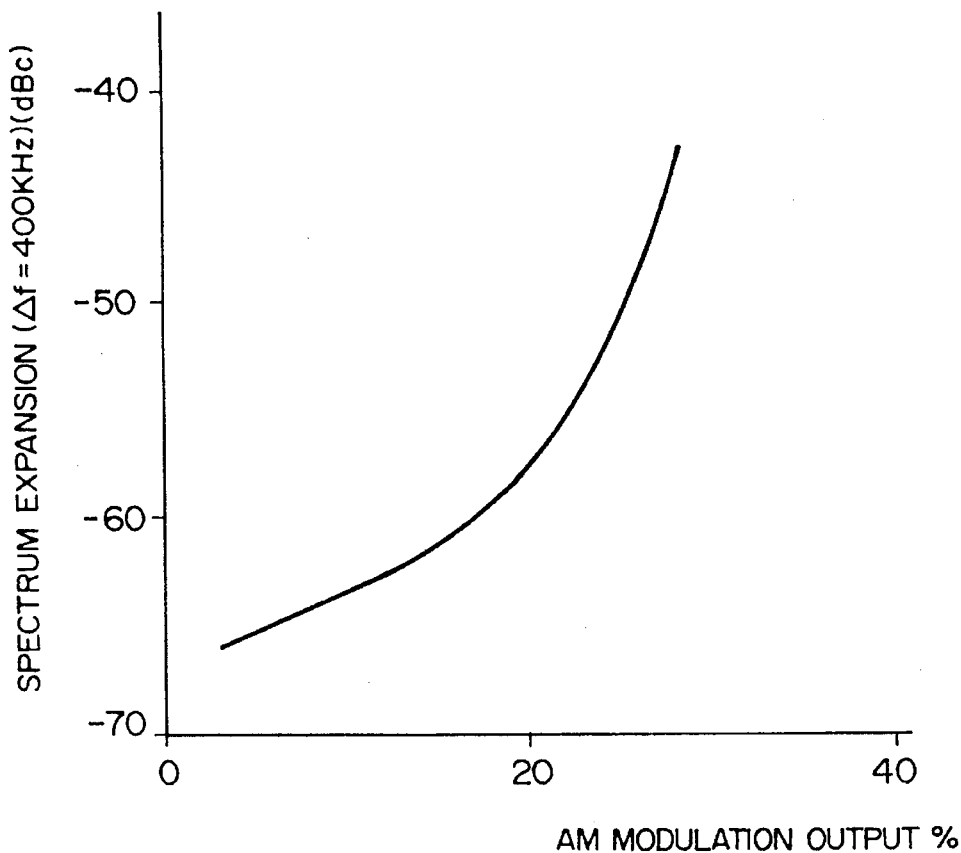

As shown in FIG. 9A, according to this embodiment, the power of the output signal Sg of the modulator 30 decreases as compared with the first embodiment described with reference to FIGS.1 and 4A. As seen from FIG. 4A, the first embodiment is configured so that the attenuation factor of the attenuator 32 is increased with the decrease of the output power of the radio-frequency power amplifier 11. According to the second embodiment shown in FIGS. 7 and 9A, in contrast, the power amplification factor of the preamplifier 33 is decreased in accordance with any decrease which may be required of the output power of the radio-frequency power amplifier 11. As a consequence, the output power of the preamplifier 33 should be understood to change in a manner similar to the output power of the attenuator 32. The input power of the radio-frequency input signal Pin in FIGS. 4B and 9B are illustrated as having the same change characteristics.

The control microcomputer 19 causes the above-described preamplifier 33 to reduce the level of the control voltage Vgc to a greater extent, the smaller the transmission power level specified to the transmission power control circuit 14 thereby to decrease the input signal power to the radio-frequency power amplifier 11. In other words, the control microprocessor 19 in the base-band section 18 detects the signal specifying the transmission power level contained in the signal wave received from the base station or the like, and applies the transmission level specification to the transmission power control circuit 14. At the same time, with the decrease in the transmission level, the level of the control voltage Vgc is set lower thereby to reduce the input signal power to the radio-frequency power amplifier 11. More specifically, as illustratively shown in FIG. 9B, in the case where the power of the output signal Pout of the radio-frequency power amplifier 11 is small, the power amplification factor of the preamplifier 33 is reduced thereby to reduce the power of the input signal Pin to the radio-frequency power amplifier 11. With the decrease in the power of the input signal Pin, the transmission power control circuit 14 increases the control voltage Vapc for the radio-frequency power amplifier 11 thereby increasing the power amplification factor thereof in order to secure a predetermined transmission power specified by the control signal φ1. This control operation is performed autonomously through a feedback loop as described above. As a result, even in the case of a small transmission power as in the first embodiment, the linearity of the amplification operation of the radio-frequency power amplifier 11 can be guaranteed.

It will be understood that the above-mentioned embodiments have the following advantages:

(1) In response to the decrease of the output power of the radio-frequency power amplifier 11 below a predetermined value, as shown in the first embodiment of FIGS. 1 and 4A, the input signal power of the radio-frequency power amplifier 11 is attenuated by the attenuator 32, or as shown in the second embodiment of FIGS. 7 and 9A, the power amplification factor of the preamplifier 33 for power-amplifying the output of the modulator 30 is decreased. In accordance with this operation, the gain of the radio-frequency power amplifier 11 is increased by negative feedback through the transmission power control circuit 14. During a predetermined small power output below 20 dBm, for example, the input signal power to the radio-frequency power amplifier 11 is reduced to, say, −3 dBm. The resulting downward trend of the transmission signal power is compensated for by increasing the gain of the radio-frequency power amplifier 11. Under this condition, the radio-frequency power amplifier 11 is operable in a linear region of the transistor the same way as during a large power output of, say, 20 dBm or more.

(2) The above-mentioned operation can guarantee the linearity of the radio-frequency power amplifier 11 over the whole operating range of transmission power. Thus, the likelihood of the modulation output signal interfering with adjacent channels is prevented when employing a digital modulation scheme having a comparatively wide output power range and requiring the linearity in the radio-frequency amplifier.

(3) The attenuator 32 is employed as a means for reducing the input signal power of the radio-frequency power amplifier 11 when the output power of the radio-frequency power amplifier 11 is reduced below a predetermine power level. Consideration of an amplification operation with the impedance matching or linearity which would be required when employing the preamplifier 33 is not required at all, and therefore the circuit configuration is simplified.

(4) In the case where the output power corresponding to the instruction from the control microcomputer 19 is required to be output by the radio-frequency power amplifier 11, the feedback control system including the transmission power detection circuit 13 and the transmission power control circuit 14 autonomously controls the power amplification factor upward with the decrease in the input signal power and downward with the increase in the input signal power. This transmission power control system inherently is a circuit for selecting and controlling the optimum transmission power from a plurality of stages of transmission power in accordance with the communication distance and the communication environment in compliance with a signal specification contained in the signal wave received from the base station or the like. Nevertheless, the transmission power control system also has the function of increasing the power amplification factor or gain of the radio-frequency power amplifier 11 when the input signal power of the radio-frequency power amplifier 11 is reduced through the attenuator 32 or the preamplifier 33. As a result, in a portable phone set having such a transmission power control system, mere addition of a circuit for selectively reducing the input power of the radio-frequency power amplifier 11 can guarantee the linearity of the amplification operation of the radio-frequency power amplifier 11 over the whole operating range of the transmission power.

(5) The specification of the transmission power is given in the form of a signal instruction contained in the signal wave received from the base station or the like. This totally eliminates the need of a complicated circuit which would require the portable phone set to detect the receiving conditions and form an instruction specifying the transmission power by itself.

(6) In the case where the instruction given on the output power to the radio-frequency power amplifier 11 specifies a level lower than a predetermined power level, the control operation is performed to increase the attenuation factor of the attenuator 32. In this way, the output power of the radio-frequency power amplifier 11 and the attenuation factor of the attenuator 32 can be controlled synchronously by means of the control microcomputer 19. The control operations are thus extremely simplified. Especially, the configuration can be simplified to maximum in the case where two options of attenuation factor of the attenuator 32 are made available.

The invention developed by the inventor was specifically explained with reference to embodiments. The present invention, however, is not limited to these embodiments and of course can be modified in various ways without departing from the spirit and scope thereof.

The nonlinear characteristic of the transistor, for example, exists with the bipolar transistor as well as with the MOS transistor. Therefore, the radio-frequency power amplifier may be a GaAs FET circuit, a bipolar transistor circuit or a Bipolar-CMOS circuit instead of a MOS circuit. The reduction of the input signal power to the radio-frequency power amplifier 11 is not limited to the configuration using the attenuator 32 but can also be employed in various forms of circuit configuration or embodiment. For example, the output power of the voltage-controlled oscillator 31 itself can be controlled. Also, the operating range of transmission power and the operating limit described with reference to FIG. 6 are only illustrative, and the invention is not confined to such specifications. The downward control of the input power to the radio-frequency power amplifier, therefore, can be performed in multiple stages shown in FIGS. 3A, 4A instead of two stages as shown in FIG. 6. The number of stages to be selected is determined taking into consideration the trade-off between the required circuit scale and the linearity improvement of the amplification operation attained by the circuit scale. The linearity suited for practical implementation is realized with a two-stage switching configuration as shown in FIG. 6. Further, a dedicated control logic may be used for forming each of the instructions from the control microcomputer 19 specifying a power decrease of a circuit like the attenuator 32 and specifying the transmission power level of the transmission power control circuit 14. Furthermore, the microcomputer 19 or the control logic may of course be made up of a gate array.

The foregoing description is primarily concerned with an automobile telephone or a portable phone in a cellular telephone system constituting a utilization field providing the background of the invention developed by the present inventors. The invention, however, is not limited to such a field, but is widely applicable also to the cordless telephone, the radio system used for guiding aircraft and various mobile communication systems including marine radio systems. The invention is applicable to wide fields under conditions effective at least for improving the linear characteristic of an amplifier.

We claim:

1. A mobile communication apparatus comprising a radio-frequency power amplifier for amplifying a modulation signal of a signal to be transmitted to control a transmission power, said apparatus comprising:

means for decreasing an input signal power applied to the radio-frequency power amplifier on a basis of instructional information contained in a signal received from an external source, said instructional information instructing an output power of the radio-frequency power amplifier to be relatively decreased below a predetermined value; and means for increasing a gain of the radio-frequency power amplifier in response to said instructional information, wherein said gain of the radio-frequency power amplifier is increased when said input signal power applied to the radio-frequency power amplifier is decreased in response to said instructional information.

2. A mobile communication apparatus according to claim 1, wherein said means for decreasing the input signal power includes an attenuator for attenuating the power of said modulation signal with a gain in accordance with a control signal generated on the basis of said instructional information contained in said received signal and applying the attenuated signal to the radio-frequency power amplifier.

3. A mobile communication apparatus according to claim 1, wherein said means for decreasing the input signal power includes a preamplifier for amplifying said modulation signal with a gain determined in accordance with a control signal generated on the basis of the instructional information contained in said received signal and applying the preamplified signal to the radio-frequency power amplifier.

4. A mobile communication apparatus according to claim 1, wherein said means for increasing the gain of the radio-frequency power amplifier includes:

control means for selecting and specifying one of a plurality of output power levels of the radio-frequency power amplifier in accordance with the instructional information contained in the signal received from an external source;

means for detecting the output power of the radio-frequency power amplifier; and transmission power control means for controlling the gain of the radio-frequency power amplifier such that the power detected by said detection means coincides with the power specified by the instructional information from said control means.

5. A mobile communication apparatus according to claim 1, wherein said radio-frequency power amplifier is biased to operate in a linear amplifying region.

6. A mobile communication apparatus according to claim 1, wherein said instructional information is received from an external source and said instructional information designates said output power of the mobile communication apparatus below a predetermined value.

7. A mobile communication apparatus comprising:

an antenna;

a radio-frequency receiving circuit for demodulating a signal received from the antenna;

a modulation circuit for modulating a signal to be transmitted from the antenna;

a radio-frequency power amplifier for oscillating the antenna on a basis of the output of the modulation circuit;

a transmission power control circuit for forming a control voltage for the radio-frequency power amplifier;

a data processor for giving an instruction on a transmission power to the transmission power control circuit in accordance with a signal instruction contained in the signal received from an external source through said antenna;

means for decreasing an input signal power level of the radio-frequency power amplifier on a basis of information representing the instruction applied from the data processor to the transmission power control circuit to relatively decrease an output power of the radio-frequency power amplifier below a predetermined level, said predetermined level being contained in the signal received from the external source; and means, responsive to the information representing the instruction applied from the data processor, for changing the amplification bias of the radio-frequency power amplifier so as to increase a gain thereof, wherein said gain of the radio-frequency power amplifier is increased when said input signal power applied to the radio-frequency power amplifier is decreased in response to said instruction.

8. A mobile communication apparatus according to claim 7, wherein said means for decreasing the input signal power level includes an attenuator for attenuating the power of a modulation signal in accordance with the control signal applied from said data processor and applying the attenuated power signal to the radio-frequency power amplifier.

9. A mobile communication apparatus according to claim 8, wherein said data processor instructs said attenuator to increase the amount of attenuation when the instruction on the transmission power applied to the transmission power control circuit specifies not more than a predetermined power level.

10. A mobile communication apparatus according to claim 7, wherein said means for decreasing the input signal power level includes a preamplifier for power-amplifying the modulation signal with a gain in accordance with the control signal applied from said data processor and applying the power-amplified modulation signal to said radio-frequency power amplifier.

11. A mobile communication apparatus according to claim 7, further comprising:

a transmission power detection circuit detecting the output power of the radio-frequency power amplifier; and a feedback circuit for said radio-frequency power amplifier including said transmission power detection circuit and said transmission power control circuit so that the power detected by said transmission power detection circuit coincides with the power level to be transmitted.

12. A mobile communication apparatus according to claim 7, wherein said radio-frequency power amplifier includes:

a plurality of MOS transistor amplifiers connected in cascade, a circuit for applying the output of said means for decreasing the input signal power level to the gate of a MOS transistor constituting an input amplifier, an output terminal connected in a manner to produce an amplified power from selected one of the source and the drain of a MOS transistor constituting an output amplifier, and a bias circuit for connecting the gates of the MOS transistors of the amplifiers in common and applying a gain control bias voltage variably from said transmission power control circuit.

13. A method for controlling the transmission power of a mobile communication terminal comprising a radio-frequency power amplifier for amplifying a digital modulation signal of a signal to be transmitted, said method comprising the steps of:

detecting instructional information instructing a terminal transmission output to be relatively decreased below a predetermined level, said detected instructional information being contained in a signal received from a station, external to the mobile communication terminal, administering communication with another party;

selectively attenuating by a predetermined amount a power level of a radio-frequency digital modulation signal generated at the terminal and modulated by the signal to be transmitted, on the basis of said detected instructional information; and applying a radio-frequency modulation signal of an attenuated power level at least to the radio-frequency power amplifier including at least one radio-frequency MOSFET and changing the gate bias of the radio-frequency MOSFET on the basis of the detected instructional information in a manner to increase the gain of the radio-frequency MOSFET, wherein said gain of the radio-frequency MOSFET is increased when said power level of said radio-frequency modulation signal is attenuated in response to said detected instructional information.

14. A method for controlling the transmission power of a mobile communication apparatus comprising a radio-frequency power amplifier for producing a transmission output by amplifying a radio-frequency digital modulation signal modulated by a telephone signal to be transmitted, said method comprising the steps of:

detecting instructional information, for instructing the transmission output of the apparatus to be relatively decreased below a predetermined level, out of the signals received from a communication administration station external to the mobile communication apparatus;

attenuating an input power to the radio-frequency power amplifier on the basis of the detected instructional information; and increasing a gain of the radio-frequency power amplifier on the basis of the detected instructional information, wherein said gain of the radio-frequency power amplifier is decreased when said input power to the radio-frequency power amplifier is increased in response to said detected instructional information.

* * * * *